(12) United States Patent
Isogai (10) Patent No.: US 10,141,190 B2
(45) Date of Patent: Nov. 27, 2018

(54) MANUFACTURING METHOD OF A SEMICONDUCTOR DEVICE

(71) Applicant: TOSHIBA MEMORY CORPORATION, Tokyo (JP)

(72) Inventor: Tatsunori Isogai, Mie (JP)

(73) Assignee: Toshiba Memory Corporation, Tokyo (JP)

(*) Notice: Subject to any disclaimer, the term of this patent is extended or adjusted under 35 U.S.C. 154(b) by 0 days.

(21) Appl. No.: 15/463,446

(22) Filed: Mar. 20, 2017

(65) Prior Publication Data

US 2018/0082843 A1 Mar. 22, 2018

Related U.S. Application Data

(60) Provisional application No. 62/396,361, filed on Sep. 19, 2016.

(51) Int. Cl.
| | |
|---|---|
| *H01L 21/336* | (2006.01) |
| *H01L 21/225* | (2006.01) |
| *H01L 27/12* | (2006.01) |
| *H01L 29/786* | (2006.01) |
| *H01L 27/1157* | (2017.01) |
| *H01L 27/11582* | (2017.01) |
| *H01L 29/04* | (2006.01) |
| *H01L 29/16* | (2006.01) |
| *H01L 29/10* | (2006.01) |
| *H01L 21/324* | (2006.01) |
| *H01L 21/02* | (2006.01) |
| *H01L 21/28* | (2006.01) |
| *H01L 21/3105* | (2006.01) |

(52) U.S. Cl.
CPC .... *H01L 21/2255* (2013.01); *H01L 21/02129* (2013.01); *H01L 21/02271* (2013.01); *H01L 21/28282* (2013.01); *H01L 21/3105* (2013.01); *H01L 21/324* (2013.01); *H01L 27/1157* (2013.01); *H01L 27/11582* (2013.01); *H01L 27/124* (2013.01); *H01L 27/1207* (2013.01); *H01L 27/1222* (2013.01); *H01L 29/04* (2013.01); *H01L 29/1037* (2013.01); *H01L 29/16* (2013.01); *H01L 29/78675* (2013.01); *H01L 29/78696* (2013.01)

(58) Field of Classification Search
CPC ................... H01L 21/2255; H01L 27/11582
USPC ............................................. 438/269
See application file for complete search history.

(56) References Cited

U.S. PATENT DOCUMENTS

| | | | |
|---|---|---|---|
| 5,173,440 A | 12/1992 | Tsunashima et al. | |
| 2006/0115948 A1* | 6/2006 | Tokunaga | H01L 29/458 438/299 |
| 2011/0079778 A1 | 4/2011 | Yamazaki et al. | |

FOREIGN PATENT DOCUMENTS

JP 2004-22900 1/2004

* cited by examiner

*Primary Examiner* — Anthony Ho
(74) *Attorney, Agent, or Firm* — Finnegan, Henderson, Farabow, Garrett & Dunner, L.L.P.

(57) ABSTRACT

In a manufacturing method of a semiconductor device according to an embodiment, an oxide film is formed on a semiconductor layer containing an impurity. A heat treatment is performed on the semiconductor layer to diffuse part of the impurity into the oxide film with hydrogen plasma treatment on the oxide film or with ultraviolet irradiation on the oxide film. After the heat treatment, the oxide film is removed.

17 Claims, 9 Drawing Sheets

MANUFACTURING METHOD OF A SEMICONDUCTOR DEVICE

CROSS REFERENCE TO RELATED APPLICATIONS

This application is based upon and claims the benefit of priority from the prior U.S. Provisional Patent Application No. 62/396,361, filed on Sep. 19, 2016, the entire contents of which are incorporated herein by reference.

Embodiments relate to a manufacturing method of a semiconductor device.

BACKGROUND

Ion implantation is generally performed to introduce an impurity into a semiconductor layer such as silicon. If the ion implantation is performed to introduce an impurity into a thin semiconductor layer, however, the impurity ions may also be introduced to other regions. Furthermore, uniformly distributing impurity ions over an inner surface of a hole with a very large aspect ratio by means of the ion implantation is difficult.

Introducing impurity ions to a semiconductor layer at the same time as forming the semiconductor layer may also be employed instead of performing the ion implantation after forming the semiconductor layer. A semiconductor layer with a relatively high impurity concentration may be obtained by this method. However, a dedicated machine for diluting an impurity to be introduced is needed to form a semiconductor layer with a relatively low impurity concentration by this method. This increases the manufacturing costs.

DETAILED DESCRIPTION

In a manufacturing method of a semiconductor device according to an embodiment, an oxide film is formed on a semiconductor layer containing an impurity. A heat treatment is performed on the semiconductor layer to diffuse part of the impurity into the oxide film with hydrogen plasma treatment on the oxide film or with ultraviolet irradiation on the oxide film. After the heat treatment, the oxide film is removed.

Embodiments will now be explained with reference to the accompanying drawings. The present invention is not limited to the embodiments. In the embodiments, "an upper direction" or "a lower direction" refers to a relative direction when a direction of a surface of a semiconductor substrate on which semiconductor elements are provided is assumed as "an upper direction". Therefore, the term "upper direction" or "lower direction" occasionally differs from an upper direction or a lower direction based on a gravitational acceleration direction.

First Embodiment

FIGS. 1 to 5 are cross-sectional views illustrating an example of a method of manufacturing a thin film transistor (TFT) according to a first embodiment. In the manufacturing method according to the first embodiment, the TFT is formed on wiring lines such as those for large-scale integration (LSI).

Figure 1:
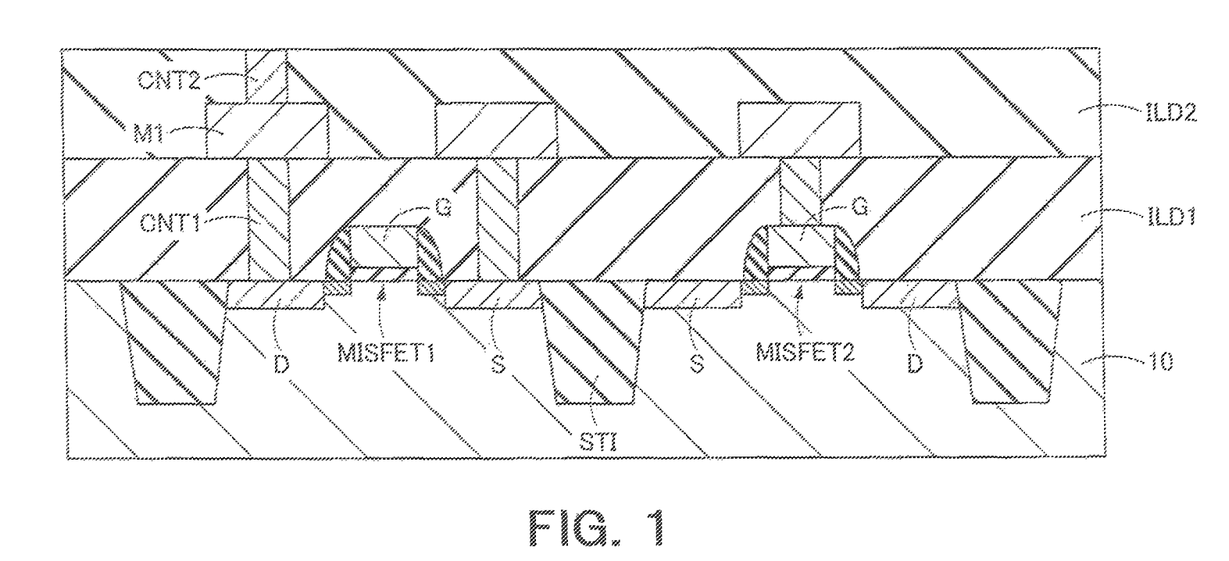
FIGS. 1 to 5 are cross-sectional views illustrating an example of a method of manufacturing a thin-film transistor (TFT) according to a first embodiment.

First, metal-insulation-semiconductor field-effect transistors (MISFETs) of an LSI are formed on a semiconductor substrate 10 as shown in FIG. 1. Each of the MISFETs includes a gate electrode G, a source layer S, and a drain layer D. Although FIG. 1 shows the two MISFETs, a MISFET 1 and a MISFET 2, more than two MISFETs may be formed on the semiconductor substrate 10.

The MISFET 1 and the MISFET 2 are covered by an interlayer insulating film ILD1. A first metal wiring line M1 is disposed on the interlayer insulating film ILD1. The drain layer D of the MISFET 1 electrically connects to the first metal wiring line M1 via a contact plug CNT1. The first metal wiring line M1 is covered by an interlayer insulating film ILD2. A contact plug CNT2 is formed through the interlayer insulating film ILD2.

Figure 2:
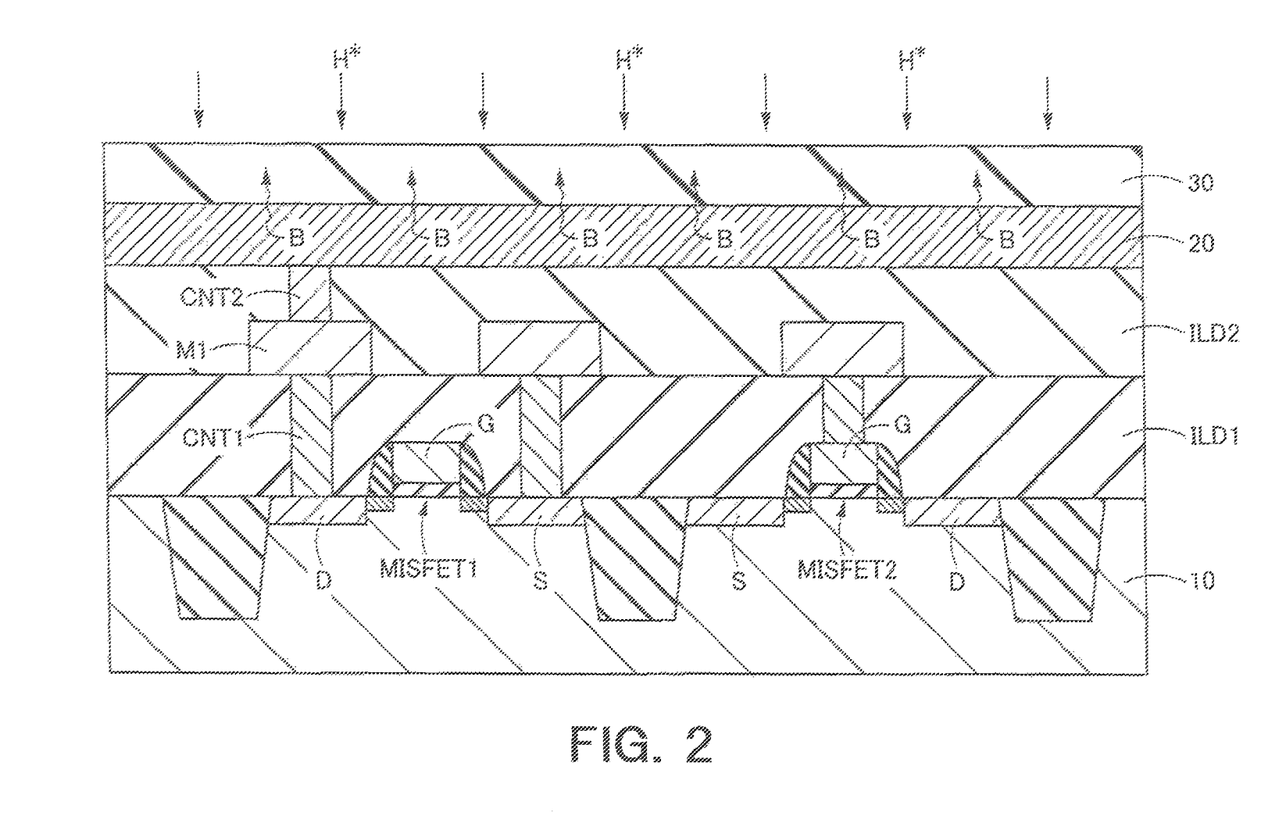

A semiconductor layer 20 is then disposed on the interlayer insulating film ILD2 and the contact plug CNT2 as shown in FIG. 2. The semiconductor layer 20 may be a polycrystalline silicon film formed by, for example, disposing an amorphous silicon film on the interlayer insulating film ILD2 and the contact plug CNT2, and then performing a heat treatment to crystallize the amorphous silicon film. Alternatively, a polycrystalline silicon film may be deposited on the interlayer insulating film ILD2 and the contact plug CNT2. At the same time as the deposition of the amorphous silicon film or the polycrystalline silicon film, boron impurity may be introduced to the film. As a result, a polycrystalline silicon film having a relatively high boron concentration, for example 1E19 $cm^{-3}$ to 1E20 $cm^{-3}$, may be formed as the semiconductor layer 20.

In order to form such a polycrystalline silicon film or amorphous silicon film, the semiconductor substrate 10 is placed in a process chamber, the temperature in the process chamber is controlled to be, for example, about 400° C., and the pressure in the process chamber is controlled to be, for example, about 5 Torr. Thereafter, $SiH_4$ gas and $BCl_3$ gas are supplied to the process chamber at a flow rate of about 1000 sccm (standard cubic centimeter per minute) and about 5 sccm, respectively. As a result, a polycrystalline silicon film or amorphous silicon film having a relatively high boron concentration may be formed on the semiconductor substrate 10. The amorphous silicon film may become a polycrystalline silicon film having a relatively high boron concentration, 1E19 $cm^{-3}$ to 1E20 $cm^{-3}$, after being crystallized by the heat treatment.

A silicon oxide film 30 is then disposed on the semiconductor layer 20 by such methods as chemical vapor deposition (CVD) or Atomic Layer Deposition (ALD). The thickness of the silicon oxide film 30 is, for example, about 20 nm. The silicon oxide film 30 is preferably in direct contact with the semiconductor layer 20. However, a film of another material, which is satisfactorily thin for boron ions to pass through, may be disposed between the semiconductor layer 20 and the silicon oxide film 30 without any problem.

A heat treatment is then performed on the semiconductor layer 20 with the silicon oxide film 30 being treated with (exposed to or irradiated with) hydrogen plasma. For example, the semiconductor substrate 10 is placed in a process chamber, the pressure in the process chamber is reduced, and argon (Ar) gas and hydrogen ($H_2$) gas, for example, are supplied into the process chamber with a flow rate of about 500 sccm and about 50 sccm, respectively. The temperature of the semiconductor substrate 10 is then raised to about 500° C. Thereafter, high-frequency electromagnetic waves of about 13.56 MHz are applied to the gases in the process chamber. This process causes hydrogen gas to discharge and become hydrogen plasma. The silicon oxide film 30 is treated with the hydrogen plasma for about 10 minutes.

Active hydrogen radicals generated in the process chamber cut Si—O bonds in the silicon oxide film 30 to form Si—H bonds and O—H bonds. Specifically, the hydrogen radicals cut the Si—O bonds in the silicon oxide film 30 to increase dangling bonds to make the Si—H bonds and the O—H bonds. The Si—H bonds and the O—H bonds are more likely to be cut than Si—O bonds. Therefore, the boron may be easily combined with Si or O in the silicon oxide film 30 and easily diffused into the silicon oxide film 30. At the same time as the hydrogen plasma treatment, a heat treatment is performed on the semiconductor layer 20. Since the hydrogen plasma has cut the Si—O bonds in the silicon oxide film 30, boron may be easily combined with Si or O in the silicon oxide film 30 in a low-temperature heat treatment at a temperature of, for example, 500° C. or less, and easily diffused from the semiconductor layer 20 into the silicon oxide film 30. As a result, the impurity concentration in the semiconductor layer 20 may be effectively reduced.

The number of manufacturing steps can be reduced by simultaneously performing the heat treatment and the hydrogen plasma treatment on the semiconductor layer 20 in the first embodiment. Of course, the heat treatment and the hydrogen plasma may be separately performed on the semiconductor layer 20 as different process steps, respectively. The silicon oxide film 30 may be irradiated with ultraviolet rays instead of the hydrogen plasma, or together with the hydrogen plasma. Ultraviolet rays also cut the Si—O bonds, and allow the silicon oxide film 30 to easily obtain boron diffused from the semiconductor layer 20 during a low-temperature heat treatment.

The heat treatment and the hydrogen plasma treatment reduce the boron concentration in the semiconductor layer 20 from a range about $1E19$ $cm^{-3}$ to about $1E20$ $cm^{-3}$ to a range about $1E16$ $cm^{-3}$ to about $1E19$ $cm^{-3}$. As a result, the boron concentration in the semiconductor layer 20 becomes suitable for a channel region of a TFT.

Boron is combined with oxygen in the silicon oxide film 30 and diffused in a form of $B_xO_y$ (where x and y each are a positive integer). Therefore, as long as there are Si and O dangling bonds in the silicon oxide film 30, boron may be diffused into the silicon oxide film 30 at a low temperature.

Figure 3:
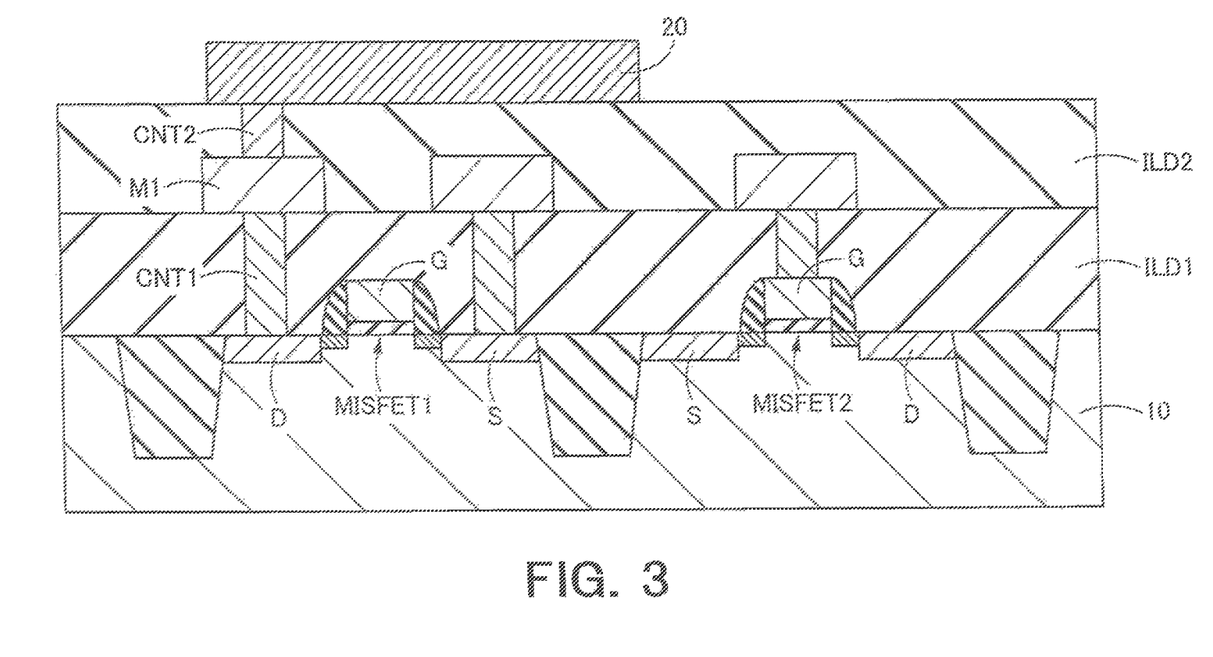

The silicon oxide film 30 is then removed by using, for example, a dilute hydrofluoric acid solution. Subsequently, the semiconductor layer 20 is processed to have a TFT formation region pattern, as shown in FIG. 3. The semiconductor layer 20 becomes a TFT device formation region (active area). An impurity may be implanted into the semiconductor layer 20, if necessary, in order to adjust the threshold voltage of the TFT.

A gate insulating film 40 is then formed on the semiconductor layer 20. The gate insulating film 40 may be, for example, a silicon oxide film, or a high-dielectric film having a higher dielectric constant than a silicon oxide film. A gate electrode 50 is then formed on the gate insulating film 40. The gate electrode 50 contains, for example, a conductive material such as doped polycrystalline silicon, or a metal.

Figure 4:
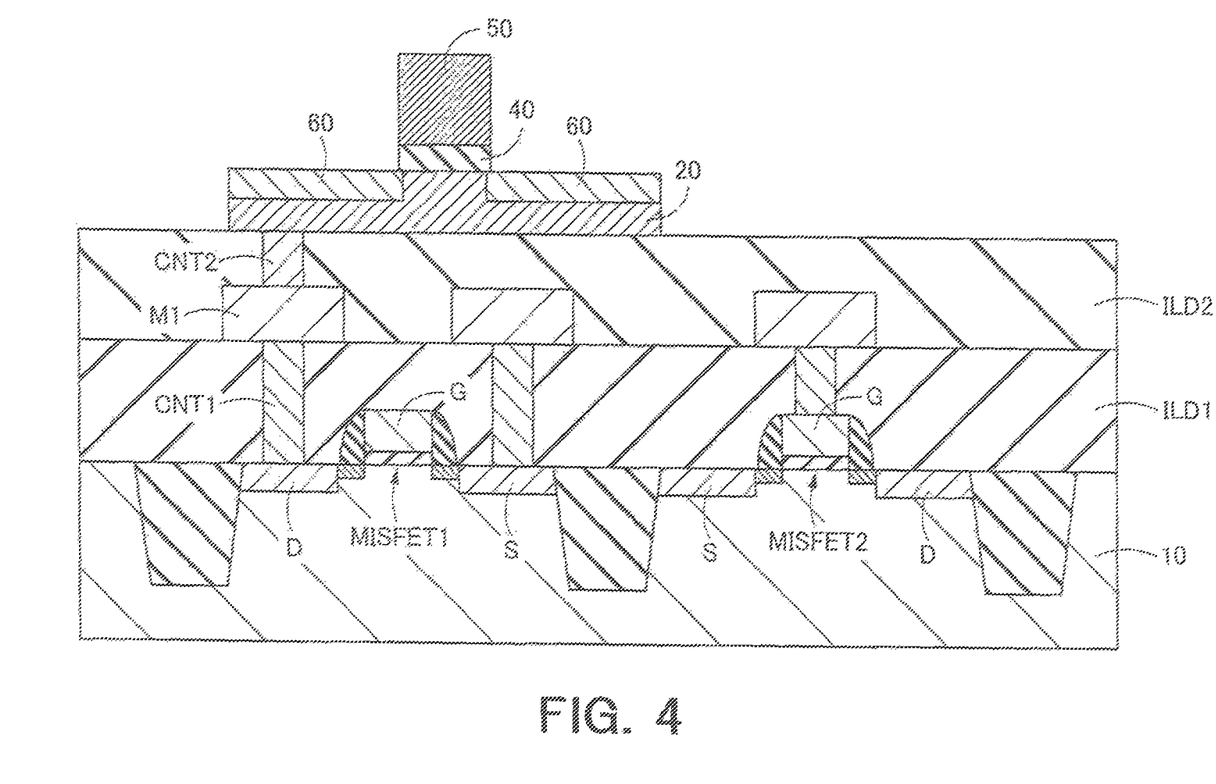

Thereafter, as shown in FIG. 4, an impurity is implanted into regions of the semiconductor layer 20 at both sides of the gate electrode 50 to form impurity layers 60 by using the gate electrode 50 as a mask. The impurity of the impurity layers 60 may be, for example, arsenic or phosphor if an n-type TFT is to be formed. If a p-type TFT is to be formed, phosphor may be used as an impurity implanted into the semiconductor layer 20, and boron may be implanted as an impurity to the impurity layers 60. The impurity layers 60 function as a source layer and a drain layer of the TFT.

Figure 5:
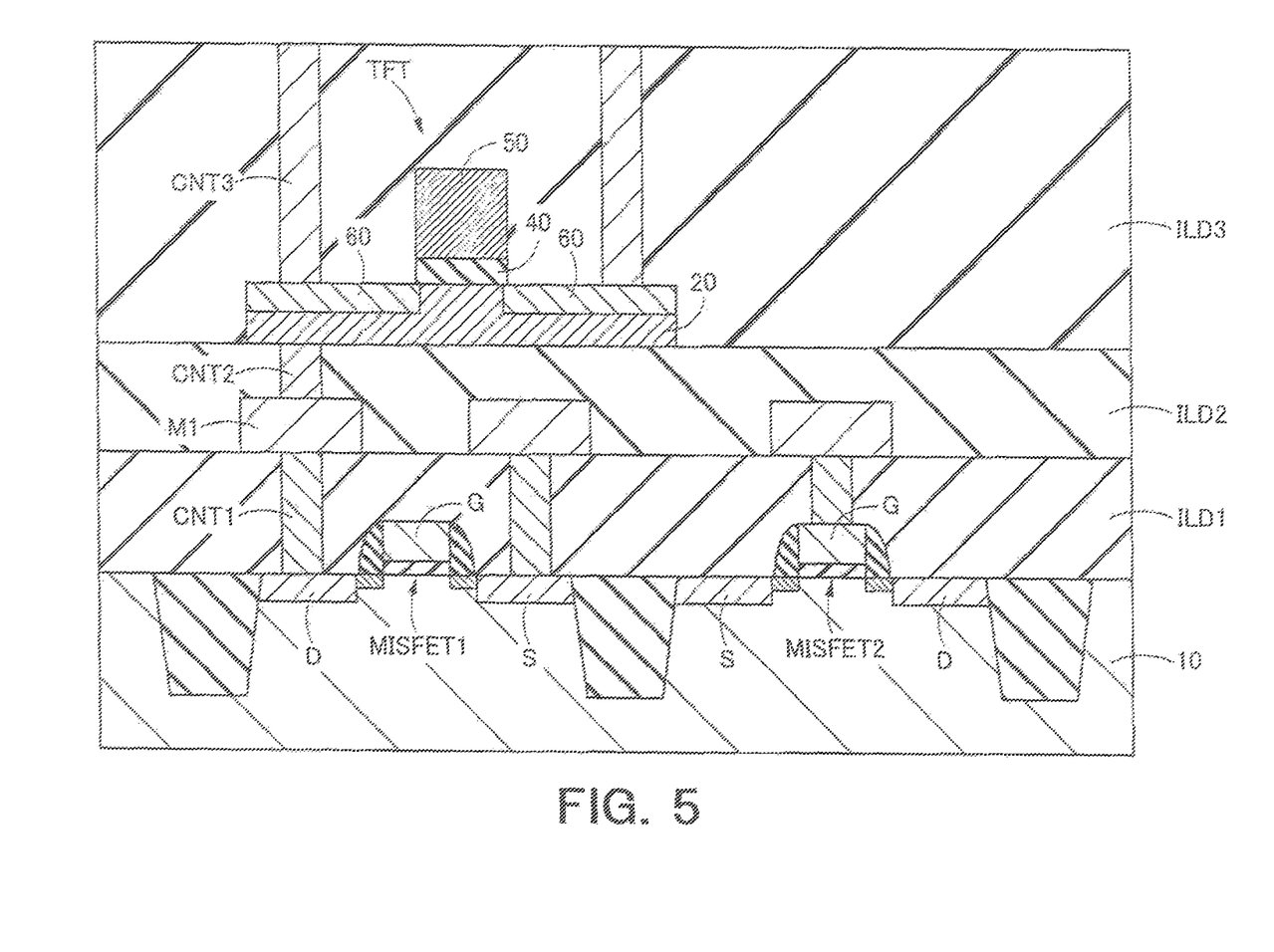

Subsequently, as shown in FIG. 5, an interlayer insulating film ILD3, a contact plug CNT3, and wiring lines (not shown in FIG. 5), for example, are formed to complete the TFT.

As described above, according to the first embodiment, the semiconductor layer 20 is brought into contact with the silicon oxide film 30 and the silicon oxide film 30 is treated with hydrogen plasma to increase Si and O dangling bonds in the silicon oxide film 30 after the silicon oxide film 30 is formed. This allows the impurity in the semiconductor layer 20 to satisfactorily diffuse into the silicon oxide film 30 during a low-temperature heat treatment at a temperature of 500° C. or less.

In order to cause the impurity in the semiconductor layer 20 to diffuse into the silicon oxide film 30 only by a heat treatment, a high-temperature heat treatment at a temperature of 850° C. or more is required. Such a high-temperature heat treatment may change the characteristics of the devices such as the MISFET 1 and the MISFET 2 that have already been formed on the semiconductor substrate 10.

In contrast, the method according to the first embodiment allows the impurity in the semiconductor layer 20 to satisfactorily diffuse into the silicon oxide film 30 by a low-temperature heat treatment at a temperature of 500° C. or less. Therefore, the change in characteristics of the devices that have already been formed on the semiconductor substrate 10 may be suppressed. As a result, the method according to the first embodiment is capable of controlling the boron concentration in the semiconductor layer 20 with the degradation in reliability of the semiconductor device being suppressed.

Figure 6:
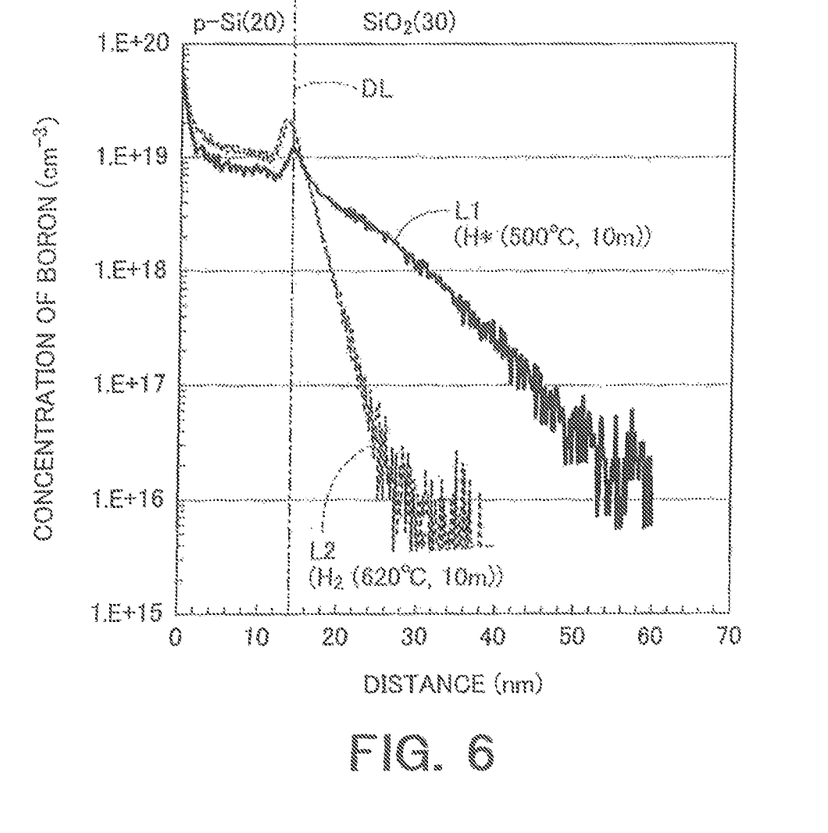
FIG. 6 is a graph showing an experimental result of a heat treatment performed on the structure shown in FIG. 2.

FIG. 6 is a graph showing a result of heat treatment experiments performed on the structure shown in FIG. 2. The line L1 shows a boron concentration after a heat treatment with hydrogen radical treatment according to the first embodiment (for example, a heat treatment at a temperature of 500° C. for 10 minutes). The line L2 shows a boron concentration after a heat treatment without hydrogen radical treatment (for example, a heat treatment at a temperature of 620° C. for 10 minutes). The lateral axis indicates the distance (height) from the bottom of the semiconductor layer 20. The broken line DL indicates the boundary between the semiconductor layer 20 and the silicon oxide film 30.

According to this graph, boron in the semiconductor layer 20 is not considerably diffused into the silicon oxide film 30 in the heat treatment indicated by the line L2. On the other hand, in the heat treatment according to the first embodiment, indicated by the line L1, more boron is diffused from the semiconductor layer 20 to the silicon oxide film 30 than in the heat treatment indicated by the line L2. It can be understood from the graph that the boron concentration in the semiconductor layer 20 after the heat treatment according to the first embodiment is less than $1E19$ $cm^{-3}$.

Modification

In the first embodiment, the hydrogen plasma treatment performed on the silicon oxide film 30 increases Si and O dangling bonds in the silicon oxide film 30 after the silicon oxide film 30 is formed. A modification of the first embodiment adopts, for example, a low-temperature CVD method and forms a (low-quality) silicon oxide film 30 that includes many dangling bonds immediately after it is formed. In this case, no hydrogen plasma treatment is needed.

In a manufacturing method according to the modification, MISFETs of an LSI are formed on a semiconductor substrate 10 as shown in FIG. 1 and a semiconductor layer 20 is formed on an interlayer insulating film ILD2 and a contact plug CNT2 as shown in FIG. 2 in the same manner as the first embodiment.

Thereafter, a silicon oxide film 30 is formed on the semiconductor layer 20 by, for example, a low-temperature CVD method. The silicon oxide film 30 is deposited at, for example, a low temperature of 300° C. or less. The silicon oxide film 30 of the modification includes dangling bonds generated by cutting Si—O bonds. The silicon oxide film 30 is formed by the following manner. The semiconductor substrate 10 is disposed in a process chamber, for example, the substrate temperature is set to be 300° C. or less, and the pressure in the process chamber is set to be about 30 Torr. Thereafter, $SiH_4$ gas and $O_2$ gas are introduced into the process chamber at a flow rate of about 300 sccm and about 500 sccm, respectively, and high frequency electromagnetic waves of about 13.56 MHz are applied to the gasses to cause plasma discharge. As a result, the silicon oxide film 30 including many dangling bonds is formed. In order to take in boron effectively, the density of dangling bonds (defect density) in the silicon oxide film 30 is preferably about 1E16 $cm^{-3}$ or above in the modification. The thickness of the silicon oxide film 30 is, for example, about 20 nm.

The semiconductor substrate 10 is then heated at a temperature of about 500° C. for about 30 minutes. This heat treatment allows the boron in the semiconductor layer 20 to diffuse into the silicon oxide film 30. As a result, the boron concentration in the semiconductor layer 20 may be reduced. A desired boron concentration may be obtained by controlling the heat treatment temperature and the heat treatment time. The heat treatment temperature and the heat treatment time are set so as not to affect other devices that are disposed on the semiconductor substrate 10, like the MISFET 1 and the MISFET 2.

The silicon oxide film 30 in the modification includes many dangling bonds from the beginning, which are obtained without the hydrogen plasma treatment. Due to the presence of the dangling bonds, boron may be easily combined with Si or O in the silicon oxide film 30, and easily diffused into the silicon oxide film 30. Therefore, a low-temperature heat treatment of, for example, 500° C. or less causes boron to easily combine with Si or O in the silicon oxide film 30 and easily diffuse from the semiconductor layer 20 into the silicon oxide film 30. As a result, the impurity concentration of the semiconductor layer 20 may be effectively reduced.

The silicon oxide film 30 is preferably in direct contact with the semiconductor layer 20, like that of the first embodiment. However, a film of another material, which is satisfactorily thin for boron to pass through, may be disposed between the semiconductor layer 20 and the silicon oxide film 30 without any problem.

The TFT according to the modification is completed after the steps described with reference to FIGS. 3 to 5 are performed.

The modification has the same effect as the first embodiment, and may reduce the boron concentration in the semiconductor layer 20 by a low-temperature heat treatment without the hydrogen plasma treatment. Therefore, the modification may further reduce the TFT manufacturing costs.

Second Embodiment

FIGS. 7 to 11 are cross-sectional views showing an example of a method of manufacturing a semiconductor memory according to a second embodiment. The semiconductor memory is, for example and not limited to, a three-dimensional NAND EEPROM (Electrically Erasable Programmable Read-Only Memory).

Figure 7:
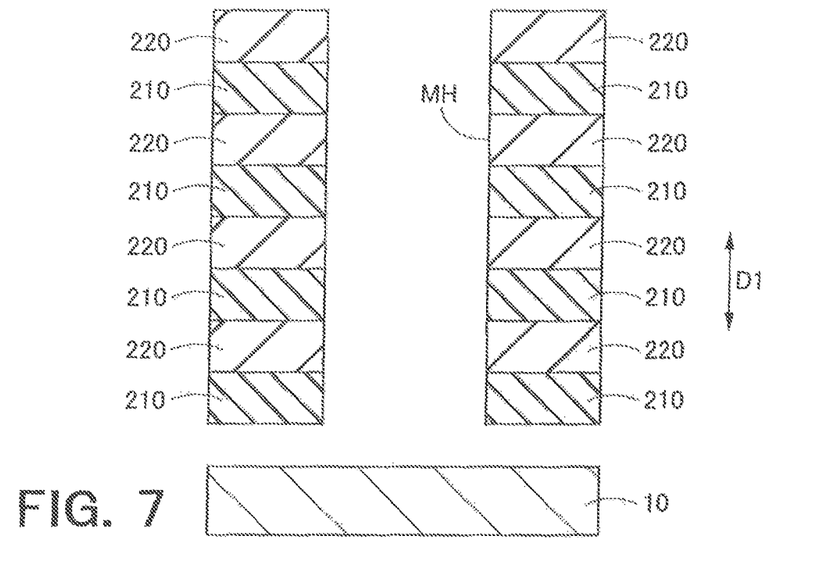
FIGS. 7 to 11 are cross-sectional views illustrating an example of a method of manufacturing a semiconductor memory according to a second embodiment.

A periphery circuit (not shown) is formed on a semiconductor substrate 10. A three-dimensional memory cell array is then formed above the periphery circuit in the following manner.

First insulating films 210 and second insulating films 220 are alternately disposed above the semiconductor substrate 10 to form a multilayer structure as shown in FIG. 7. The second insulating films 220 act as sacrificial films, for example, which are replaced with metal wiring lines later, and are, for example, insulating films such as silicon nitride films. The metal wiring lines replacing the second insulating films 220 act as word lines (gate electrodes) of the memory. The metal wiring lines are formed of, for example, a low-resistance metal such as tungsten. The first insulating films 210 are disposed to act as insulating films between wiring lines, for insulating word lines, arranged in the stacking direction of the multilayer structure. The first insulating films 210 are insulating films such as silicon oxide films, for example.

A memory hole MH is then formed through the multilayer structure including the first insulating films 210 and the second insulating films 220. The memory hole MH is patterned to extend in a stacking direction D1 in the multilayer structure.

Figure 8:
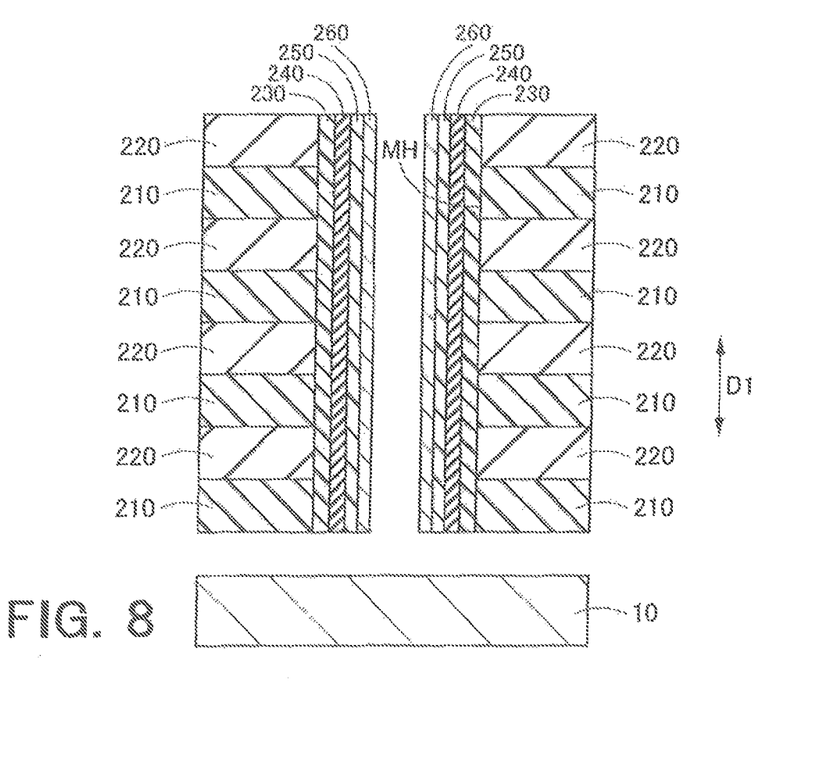

Thereafter, a block insulating film 230, a charge accumulation layer 240, and a tunnel insulating film 250 are sequentially formed on the inner surface of the memory hole MH as shown in FIG. 8. The block insulating film 230 is, for example, a silicon oxide film, and disposed to prevent the leakage of the charge (electrons) in the charge accumulation layer 240 to the word line side. The charge accumulation layer 240 is, for example, a silicon nitride film, and stores data by accumulating or discharging electric charge. The tunnel insulating film 250 allows the electric charge to pass from a channel layer that will be described later to the charge accumulation layer 240 when the electric charge is accumulated in the charge accumulation layer 240, or allows the electric charge in the charge accumulation layer 240 to move to the channel layer when the charge accumulation layer 240 discharges the electric charge. The block insulating film 230, the charge accumulation layer 240, and the tunnel insulating film 250 may be formed of a high dielectric material having a higher dielectric constant than, for example, a silicon oxide film.

A channel layer 260 served as a semiconductor layer is then formed on the tunnel insulating film 250 in the memory hole MH. The channel layer 260 is formed by first depositing an amorphous silicon film on the tunnel insulating film 250, and then crystallizing the amorphous silicon film by a heat treatment to obtain a polycrystalline silicon film acting as the channel layer 260. Alternatively, a polycrystalline silicon film that will act as the channel layer 260 may be deposited. Boron impurity may be implanted into the amorphous silicon film or the polycrystalline silicon film at the same time as the deposition of the film. As a result, for example, a polycrystalline silicon film having a relatively high boron concentration of $1E19$ cm$^{-3}$ to $1E20$ cm$^{-3}$ may be formed as the channel layer 260.

In order to form such a polycrystalline silicon film or amorphous silicon film, the semiconductor substrate 10 is placed in a process chamber, the temperature in the process chamber is set at, for example, about 400° C., the pressure in the process chamber is set at, for example, about 5 Torr, and SiH$_4$ gas and BCl$_3$ gas are supplied to the process chamber at a flow rate of about 1000 sccm and about 5 sccm, respectively. As a result, a polycrystalline silicon film or amorphous silicon film having a high boron concentration may be formed on the tunnel insulating film 250. The amorphous silicon film may be crystallized by a heat treatment to become a polycrystalline silicon film having a relatively high boron concentration of $1E19$ cm$^{-3}$ to $1E20$ cm$^{-3}$. The memory hole MH has a very large aspect ratio. Therefore, the amorphous silicon film or polycrystalline silicon film may be deposited under different conditions if necessary.

Figure 9:
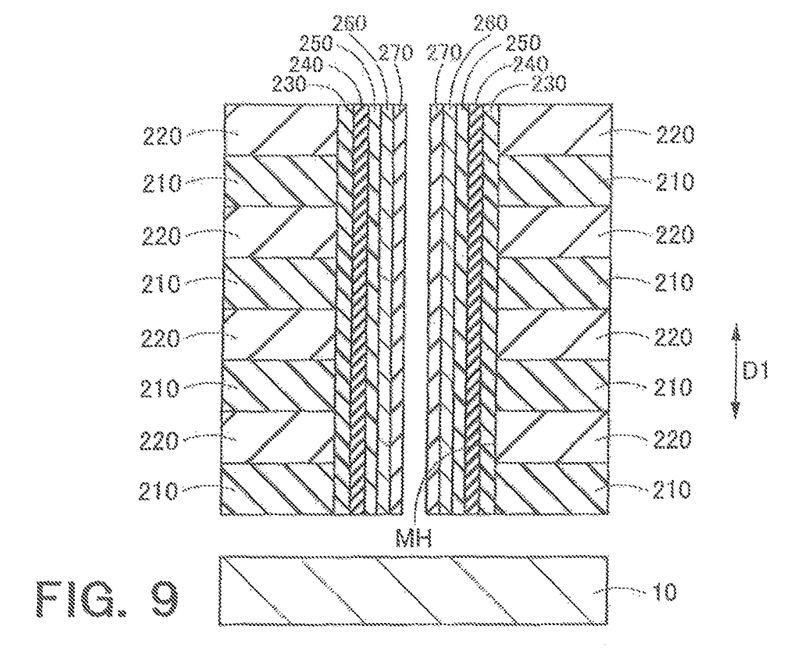

Subsequently, a silicon oxide film 270 is formed by CVD or ALD, for example, on the channel layer 260 in the memory hole MH, as shown in FIG. 9. The thickness of the silicon oxide film 270 is, for example, about 20 nm. The silicon oxide film 270 is preferably in direct contact with the channel layer 260. However, a film of another material, which is satisfactorily thin for boron to pass through, may be disposed between the channel layer 260 and the silicon oxide film 270 without any problem.

Thereafter, a heat treatment is performed on the channel layer 260 with the silicon oxide film 270 being treated with hydrogen plasma. For example, like the first embodiment, the semiconductor substrate 10 is placed in a process chamber, the pressure in the process chamber is reduced, and argon (Ar) gas and hydrogen (H$_2$) gas, for example, are supplied to the process chamber at a flow rate of about 500 sccm and about 50 sccm, respectively. Subsequently, the semiconductor substrate 10 is heated to about 500° C., and high-frequency electromagnetic waves of about 13.56 MHz are applied to the gasses in the process chamber. As a result, the hydrogen gas is caused to discharge and become hydrogen plasma. The silicon oxide film 270 is treated with this hydrogen plasma. The hydrogen plasma treatment is performed for about 10 minutes.

As in the first embodiment, the channel layer 260 is heated at the same time as the hydrogen plasma treatment. As a result, boron is allowed to be easily combined with Si or O in the silicon oxide film 270 and easily diffused from the channel layer 260 to the silicon oxide film 270 even at a low temperature of, for example, 500° C. or less. Therefore, the impurity concentration in the channel layer 260 may be effectively reduced. Thus, the second embodiment may have the same effect as the first embodiment.

Although the silicon oxide film 270 is treated with hydrogen plasma in the second embodiment, the silicon oxide film 270 may be irradiated with ultraviolet rays instead of or together with the hydrogen plasma. The ultraviolet rays also cut Si—O bonds, and therefore allow the silicon oxide film 270 to obtain boron diffused from the channel layer 260 even during a low-temperature heat treatment.

Due to the heat treatment and the hydrogen plasma treatment, the boron concentration in the channel layer 260 is reduced from a range of about $1E19$ cm$^{-3}$ to about $1E20$ cm$^{-3}$ to a range of about $1E16$ cm$^{-3}$ to about $1E19$ cm$^{-3}$. As a result, the boron concentration of the channel layer 260 becomes suitable for channel regions of memory cells.

Figure 10:
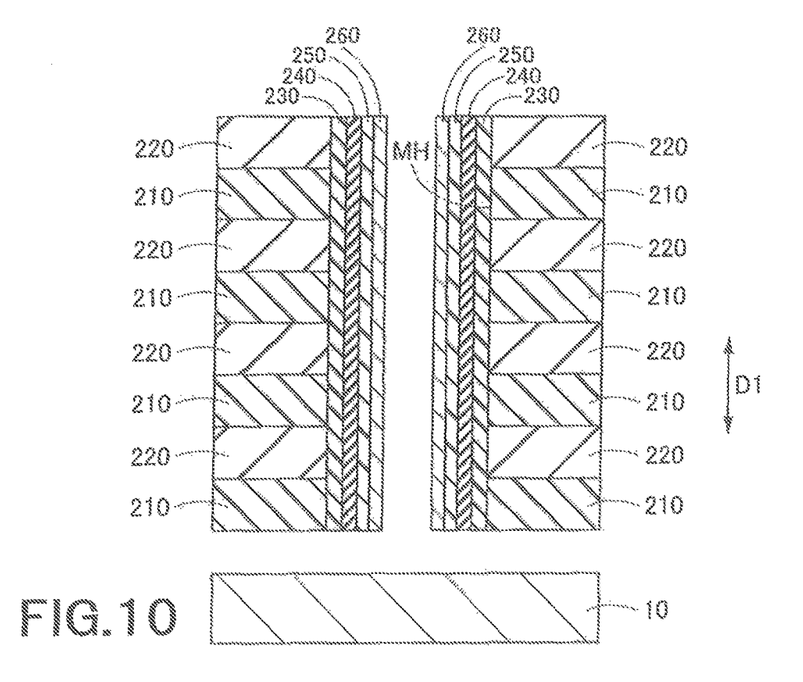

The silicon oxide film 270 is then removed by using a dilute hydrofluoric acid solution, for example, as shown in FIG. 10.

Figure 11:
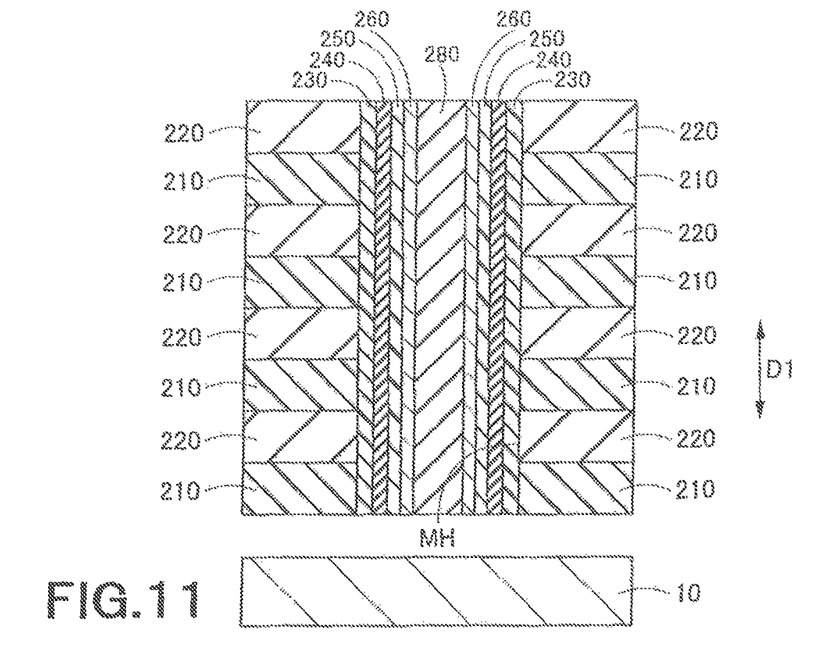

Subsequently, a core material 280 is filled in the memory hole MH by means of ALD, for example, as shown in FIG. 11. The core material 280 may be, for example, a good-quality silicon oxide film having not so many dangling bonds in order to maintain good interface characteristics between the core material 280 and the channel layer 260. If the interface characteristics between the core material 280 and the channel layer 260 are not a problem, the silicon oxide film 270 is not necessarily removed but an insulating film may be simply filled to the memory hole MH. In this case, the silicon oxide film 270 and the insulating film act as the core material. Thereafter, a slit (not shown) is formed in the multilayer structure separately from the memory hole MH, and the second insulating film 220 is removed through the slit. Furthermore, a metal material is filled to the spaces made by removing the second insulating films 220 to form metal wiring lines. Thus, the second insulating films 220 are replaced with the metal wiring lines, which act as word lines. Interlayer insulating films and other wiring lines are then formed to complete a semiconductor memory.

According to the second embodiment, after the silicon oxide film 270 is formed, Si and O dangling bonds in the silicon oxide film 270 are increased by treating the silicon oxide film 270 with hydrogen plasma with the silicon oxide film 270 being in direct contact with the channel layer 260. As a result, the impurity in the channel layer 260 may be considerably diffused into the silicon oxide film 270 even during a low-temperature heat treatment at a temperature of 500° C. or less. Thus, like the first embodiment, the boron concentration in the channel layer 260 may be controlled with the change in characteristics of the devices formed on the semiconductor substrate 10 being suppressed in the second embodiment.

The semiconductor memory in the second embodiment is a charge-trap memory including the charge accumulation layer 240. However, the semiconductor memory may be a floating-gate memory including a floating gate instead of the charge accumulation layer 240.

Modification

The aforementioned modification may be applied to the second embodiment. Specifically, a (low-quality) silicon oxide film 270 having dangling bonds from the beginning may be formed on the channel layer 260 by, for example, low-temperature CVD. In this case, the hydrogen plasma treatment is not needed.

The silicon oxide film 270 according to the modification includes many dangling bonds in which Si—O bonds are cut. The silicon oxide film 270 may be formed in the same manner as the silicon oxide film 30 according to the modification of the first embodiment.

The semiconductor substrate 10 is then heated at a temperature of about 500° C. for about 30 minutes. As a result, boron in the channel layer 260 may be diffused to the silicon oxide film 270 to reduce the boron concentration of the channel layer 260. A desired boron concentration may be obtained by adjusting the heat treatment temperature and the heat treatment time. The heat treatment temperature and the heat treatment time are set so as not to affect other devices formed on the semiconductor substrate 10.

The silicon oxide film 270 according to the modification includes many dangling bonds from the beginning. Therefore, boron may be easily combined with Si or O in the silicon oxide film 270 and easily diffused into the silicon oxide film 270. Thus, even in a low-temperature heat treatment at a temperature of 500° C. or less, boron may be easily combined with Si or O in the silicon oxide film 270 and easily diffused from the channel layer 260 to the silicon oxide film 270. As a result, the impurity concentration in the channel layer 260 may be effectively reduced. In order to obtain this effect, the dangling bond density in the silicon oxide film 270 is preferably about $1E16$ $cm^{-3}$ or more in the modification. As described above, the modification of the first embodiment may be applied to the second embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device comprising:
    forming a multilayer structure by stacking first insulating films and second insulating films or metal films;
    forming a hole through the multilayer structure in a stacking direction;
    forming a block insulating film, a charge storage film, and a tunnel insulating film on an inner surface of the hole;
    forming the semiconductor layer containing the impurity on the tunnel insulating film on the inner surface of the hole;
    forming an oxide film on the semiconductor layer containing an impurity;
    performing a heat treatment on the semiconductor layer to diffuse part of the impurity into the oxide film with hydrogen plasma treatment on the oxide film or ultraviolet irradiation on the oxide film; and
    removing the oxide film after the heat treatment.

2. The method according to claim 1, wherein:
    the semiconductor layer contains silicon;
    the oxide film contains silicon oxide and
    the impurity is boron.

3. The method according to claim 2, wherein a boron concentration in the semiconductor layer after removing the oxide film is $1E19$ $cm^{-3}$ or less.

4. The method according to claim 3, wherein the hydrogen plasma exposure or the ultraviolet irradiation is performed while the heat treatment is performed on the semiconductor layer.

5. The method according to claim 2, wherein the hydrogen plasma exposure or the ultraviolet irradiation is performed while the heat treatment is performed on the semiconductor layer.

6. The method according to claim 1, wherein the heat treatment is performed on the semiconductor layer at a temperature of 500° C. or less.

7. The method according to claim 6, wherein the hydrogen plasma exposure or the ultraviolet irradiation is performed while the heat treatment is performed on the semiconductor layer.

8. The method according to claim 1, wherein the hydrogen plasma exposure or the ultraviolet irradiation is performed while the heat treatment is performed on the semiconductor layer.

9. The method according to claim 1, further comprising, after the oxide film is removed:
    forming a gate insulating film on the semiconductor layer;
    forming a gate electrode on the gate insulating film; and
    forming a source region and a drain region at both sides on the gate electrode in the semiconductor layer.

10. The method according to claim 1, further comprising, after the oxide film is removed, filling the hole with an insulating film.

11. The method according to claim 1, further comprising, after the oxide film is removed, filling the hole with an insulating film.

12. A method of manufacturing a semiconductor device comprising:
    depositing an oxide film on a semiconductor layer containing an impurity by a CVD method at a temperature of 300° C. or less;
    performing a heat treatment on the semiconductor layer to diffuse part of the impurity into the oxide film; and
    removing the oxide film.

13. The method according to claim 12, wherein:
    the semiconductor layer contains silicon;
    the oxide film contains silicon oxide; and
    the impurity is boron.

14. The method according to claim 13, wherein a boron concentration in the semiconductor layer after removing the oxide film is $1E19$ $cm^{-3}$ or less.

15. The method according to claim 12, wherein the heat treatment is performed on the semiconductor layer at a temperature of 500° C. or less.

16. The method according to claim 12, further comprising, after the oxide film is removed:
    forming a gate insulating film on the semiconductor layer;
    forming a gate electrode on the gate insulating film; and
    forming a source region and a drain region at both sides on the gate electrode in the semiconductor layer.

17. The method according to claim 12, further comprising, before the oxide film is formed on the semiconductor layer containing the impurity:
    forming a multilayer structure by stacking first insulating films and second insulating films or metal films;
    forming a hole through the multilayer structure in a direction substantially perpendicular to a stacking direction;
    forming a block insulating film, a charge storage film, and a tunnel insulating film on an inner surface of the hole; and
    forming the semiconductor layer containing the impurity on the tunnel insulating film on the inner surface of the hole.

* * * * *